United States Patent
Komatsu (10) Patent No.: US 6,430,046 B1
(45) Date of Patent: Aug. 6, 2002

(54) MOUNT SHELF FOR AN ELECTRONIC CIRCUIT BOARD

(75) Inventor: Kazuo Komatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/924,470

(22) Filed: Aug. 9, 2001

(30) Foreign Application Priority Data

Aug. 11, 2000 (JP) ......................................... 2000-243941

(51) Int. Cl.[7] ................................................. H05K 7/20
(52) U.S. Cl. ......................... 361/690; 361/683; 361/721; 361/727; 361/736; 361/741; 361/752; 361/756; 165/104.33; 211/41.17; 454/184; 312/223.2
(58) Field of Search ................................. 361/690, 692, 361/687, 688, 727, 741, 756, 802; 211/41.17, 41.12; 454/184; 174/16.1; 165/104.33

(56) References Cited

U.S. PATENT DOCUMENTS

| 3,716,760 A | * | 2/1973 | Bertellotti et al. | 361/802 |
| 4,328,897 A | * | 5/1982 | Weiss | 211/41.17 |
| 5,353,198 A | * | 10/1994 | Kabat et al. | 361/802 |
| 5,735,407 A | * | 4/1998 | Kallio | 206/707 |

FOREIGN PATENT DOCUMENTS

| JP | 59-181692 | 10/1984 |
| JP | 64-387 | 1/1989 |
| JP | 8-23181 | 1/1996 |

* cited by examiner

*Primary Examiner*—Boris Chervinsky
(74) *Attorney, Agent, or Firm*—McGinn & Gibb, PLLC (57) ABSTRACT

A mount shelf for an electronic circuit board, includes a body; a first guide which is supported by the body and has a first guide plane; a second guide which is supported by the body and has a second guide plane; a third guide which is supported by the body and has a third guide plane; and a fourth guide which is supported by the body and has a fourth guide plane. The first guide plane and the second guide plane respectively have first contact planes on which a first end plane portion of one straight first edge region of an electronic circuit board can be contact at a same time. The third guide plane and the fourth guide plane respectively have second contact planes on which a second end plane portion of another straight second edge region of the electronic circuit board can be contact at the same time. The first guide and the second guide are separated to a degree of a width in a direction in which the first edge region or the second edge region of the electronic circuit board is extended. The third guide and the fourth guide are separated to the degree of the width.

18 Claims, 8 Drawing Sheets

MOUNT SHELF FOR AN ELECTRONIC CIRCUIT BOARD

BACKGROUND OF THE INVENTION

1. Field of the Invention

The present invention relates to a mount shelf for an electronic circuit board. More particularly, the present invention relates to a mount shelf for an electronic circuit board, which has an excellent air permeability at a condition that an electronic circuit board is positioned and mounted in a body plate and also has an excellent radiation performance with regard to a heat generated by a part of the electronic circuit.

2. Description of the Related Art

Figure 1:
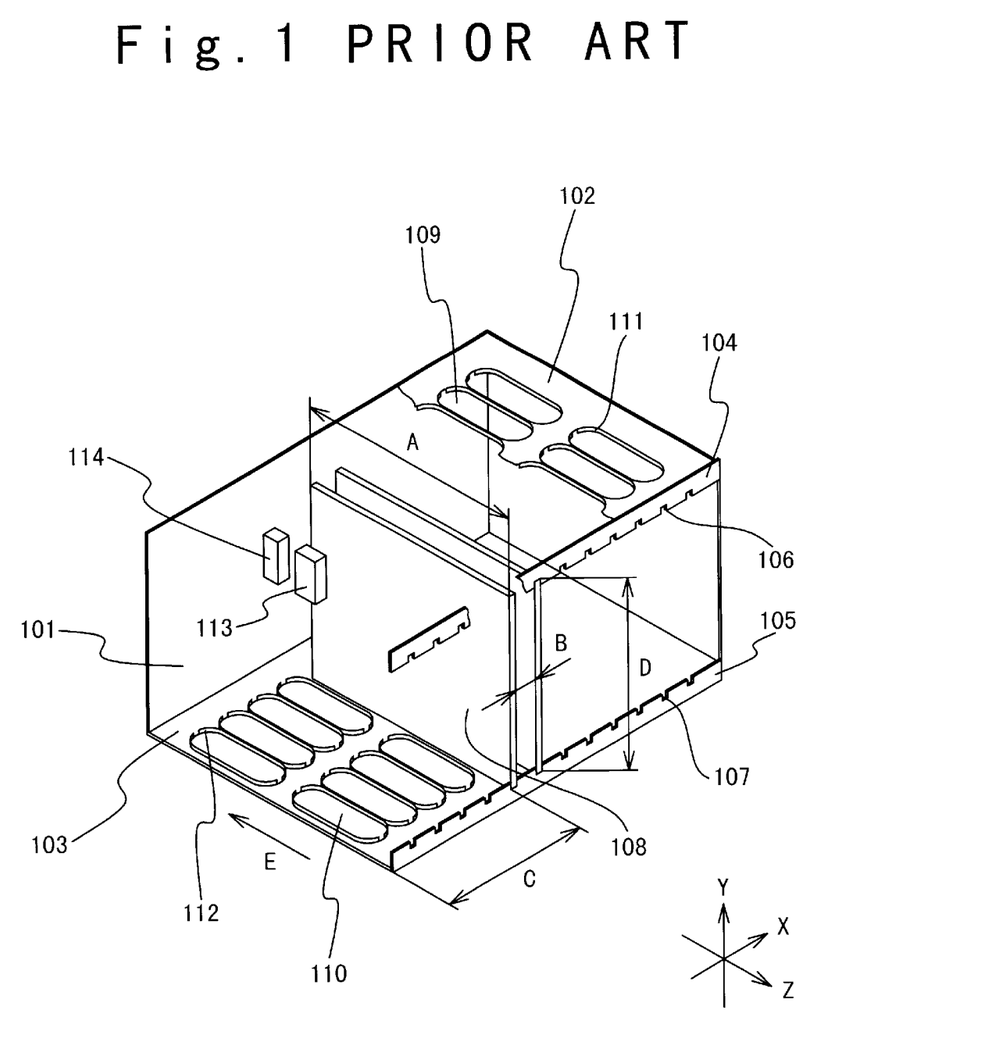
FIG. 1 is an axis projection view showing a known shelf.

As known in Japanese Laid Open Utility Model Application (JU-A-Showa, 64-387) and Japanese Laid Open Patent Application (JP-A-Heisei, 8-23181), an electronic circuit board is assembled in an electronic apparatus, such as a computer and a communication apparatus, and it is mounted in a body plate. The electronic circuit board mounted in a shelf structure requires the protection against heat generated by it. The shelf which is a mount technique for improving the heat radiation performance is known as shown in FIG. 1. The body plate for embodying the known shelf is constituted by a side plate 101, a ceiling plate 102 and a bottom plate 103. Opposite positioning grooves 106, 107 are formed on an upper guide plate 104 and a lower guide plate 105 which are respectively attached to edges of the ceiling plate 102 and the bottom plate 103. An electronic circuit board 108 is positioned in upper and lower edge regions of the positioning grooves 106, 107, and inserted towards the side plate 101. A large number of long holes 109, 110 are made in the ceiling plate 102 and the bottom plate 103. Guide rims 111, 112 are formed in the edges of the long holes 109, 110. Both ends of the rims 111, 112 are cylindrically formed. A tip end of the electronic circuit board 108 is guided between the planes of the cylinders adjacent to each other, and inserted towards the side plate 101.

At that mount position, a connector 113 attached to the electronic circuit board 108 is electrically connected to a connector 114 attached to the side plate 101. The electrically attached parts of the connectors 113, 114 are constituted by minute metallic parts. In order to effectively connect such minute metallic parts, the relatively positional relations must be accurate between the long holes 109, 110 and the positioning grooves 106, 107. The positional relations must be accurate as a three-dimension, as represented by the three-dimensional coordinates in FIG. 1. Actually, the dimensional setting must be relationally accurate between a Z-axis direction distance A between the side plate 101 and the upper and lower guide plates 105, 106, X-axis direction distances B, C from the standard positions of the upper and lower positioning grooves 106, 107 and a Y-axis direction distance D between the upper and lower positioning grooves 106, 107. If such a dimensional setting is not accurate, a travel direction E when the electronic circuit board is inserted is not accurately coincident with the set Z-axis direction. Even if the mount position is approximately accurate, the electrical connection becomes imperfect between the connectors 113, 114. If the unreasonably pushing force at the time of the insertion is excessive, the electrical connection becomes imperfect. Such known structure requires the highly precise design in order to attain the excellently electrical connection. This results in the increase in a manufacturing cost. Moreover, the plates constituting the large number of holes resist the flow of the air flowing from a lower portion to an upper portion. This resistance causes the flow to be deteriorated. Thus, the air flow becomes the turbulent flow, which causes the heat radiation performance to be poor.

The positioning accuracy is desired to be high. In particular, it is desirable that the unreasonably excessive force is not applied at the time of the insertion, the insertion is smooth, and the positioning accuracy is high. Moreover, the heat radiation performance is desired to be high. It is further required to simplify the shelf structure and drop the manufacturing cost.

Japanese Laid Open Patent Application (JP-A-Showa, 59-181692) discloses the following positioning apparatus of printed circuit board. This positioning apparatus of printed circuit board transfers the printed circuit board to a station to perform a operation such as parts mounting. The positioning apparatus of printed circuit board is provided with: a plurality of guide means for guiding right and left end portions of the printed circuit board to the station. One of the plurality of guide means can move in a direction at right angles to a transferring direction of the printed circuit board. The other of the plurality of guide means cannot move. A plurality of positioning pins to be inserted in reference holes of the printed circuit board are provided in the transferring direction at established intervals. A part of the plurality of positioning pins can move only in the direction at right angles to the transferring direction of the printed circuit board. Another part of the plurality of positioning pins can move in both the direction at right angles to the transferring direction of the printed circuit board and the transferring direction.

SUMMARY OF THE INVENTION

The present invention is accomplished in view of the above mentioned problems. Therefore, an object of the present invention is to provide a mount shelf for an electronic circuit board, in which a positioning accuracy is high and a cost can be dropped.

Another object of the present invention is to provide a mount shelf for an electronic circuit board, in which an unreasonably excessive force is not applied at a time of an insertion, an insertion is smooth, a positioning accuracy is high, and a cost can be dropped.

Still another object of the present invention is to provide a mount shelf for an electronic circuit board, in which a positioning accuracy is high, a cost can be dropped, and a heat radiation performance is high.

Still another object of the present invention is to provide a mount shelf for an electronic circuit board, in which when a shelf body is made of metal, the abovementioned problems can be effectively solved.

In order to achieve an aspect of the present invention, a mount shelf for an electronic circuit board, includes: a body; a first guide which is supported by the body and has a first guide plane; a second guide which is supported by the body and has a second guide plane; a third guide which is supported by the body and has a third guide plane; and a fourth guide which is supported by the body and has a fourth guide plane, and wherein the first guide plane and the second guide plane respectively have first contact planes on which a first end plane portion of one straight first edge region of an electronic circuit board can be contact at a same time, and wherein the third guide plane and the fourth guide plane respectively have second contact planes on which a second end plane portion of another straight second edge region of the electronic circuit board can be contact at the same time, and wherein the first guide and the second guide are separated to a degree of a width in a direction in which the first edge region or the second edge region of the electronic circuit board is extended and wherein the third guide and the fourth guide are separated to the degree of the width.

In this case, the first contact plane includes two first slants which are located opposite to each other, and slanted in directions opposite to each other, and in forms of substantially circular cone plane, and wherein the second contact plane includes two second slants which are located opposite to each other, and slanted in directions opposite to each other, and in forms of substantially circular cone plane.

Also in this case, the first and second edge regions are approximately parallel to each other.

Further in this case, the first end plane portion contains two first end lines parallel to each other, and the second end plane portion contains two second end lines parallel to each other.

In this case, the first slant and the second slant are both formed in perfectly circular cone planes.

Also in this case, the first guide and the second guide have a first plurality of protrusions respectively aligned in a straight line direction, and wherein the third guide and the fourth guide have a second plurality of protrusions respectively aligned in a straight line direction, and wherein the first plurality of protrusions are respectively constituted by the first slant, and the second plurality of protrusions are respectively constituted by the second slant.

Further in this case, the mount shelf for an electronic circuit board further includes: a first positioning unit integrally formed into the body; and a second positioning unit integrally formed into the body, and wherein the first positioning unit has a first plurality of grooves for guiding the first edge region, and the second positioning unit has a second plurality of grooves for guiding the second edge region, and wherein positions of the first plurality of grooves correspond to positions of a first plurality of valleys between the first plurality of protrusions, respectively, and positions of the second plurality of grooves correspond to positions of a second plurality of valleys between the second plurality of protrusions, respectively.

In this case, a portion between the two first slants is formed in a cylindrical plane, and a portion between the two second slants is formed in the cylindrical plane.

In order to achieve another aspect of the present invention, a mount shelf for an electronic circuit board, includes: a body; and four guides which are supported by the body, and respectively have axis lines parallel to each other, and are extended in directions of axis lines, and wherein each of the four guides has a plurality of concave grooves aligned in the direction of the axis line, and wherein each of the plurality of concave grooves has both sides crossing the axis line and a cylindrical plane for connecting between the both sides, and wherein two the cylindrical planes of the four guides can contact with one edge region of the electronic circuit board at a same time, and the other two cylindrical planes of the four guides can contact with another edge region of the electronic circuit board at the same time.

In this case, the cylindrical plane is partially cylindrical.

Also in this case, the both sides are formed on a crossing tapered plane which are not orthogonal to the axis line.

Further in this case, the tapered plane is a circular cone plane.

In this case, the circular cone plane is a perfectly circular cone plane.

Also in this case, an outer circumference plane of each of the guides is cylindrical between the plurality of concave grooves.

In order to achieve still another aspect of the present invention, a mount shelf for an electronic circuit board, includes: peripheral walls; and four support bars supported on the peripheral walls in an inner space formed by the peripheral walls, and wherein the four support bars position and support four-point regions around edges of a rectangular electronic circuit board, and wherein a streamline plane in which air stream in a direction from two the support bars of the four support bars to the other two support bars is not turbulent is formed on the support bar.

In this case, an interference obstacle to a flow of the air stream flowing in the direction is not present except the four support bars.

Also in this case, the streamline plane is formed on a front side and a rear side of the air stream.

Further in this case, the four support bars have groove spaces for positioning the four-point regions, and wherein circumference of the groove space is formed on the streamline plane.

In this case, the streamline plane is formed symmetrically about the axis line of the support bar.

DESCRIPTION OF THE PREFERRED EMBODIMENTS

Embodiments of the present invention will be described below in detail with reference to the attached drawings.

Figure 2:
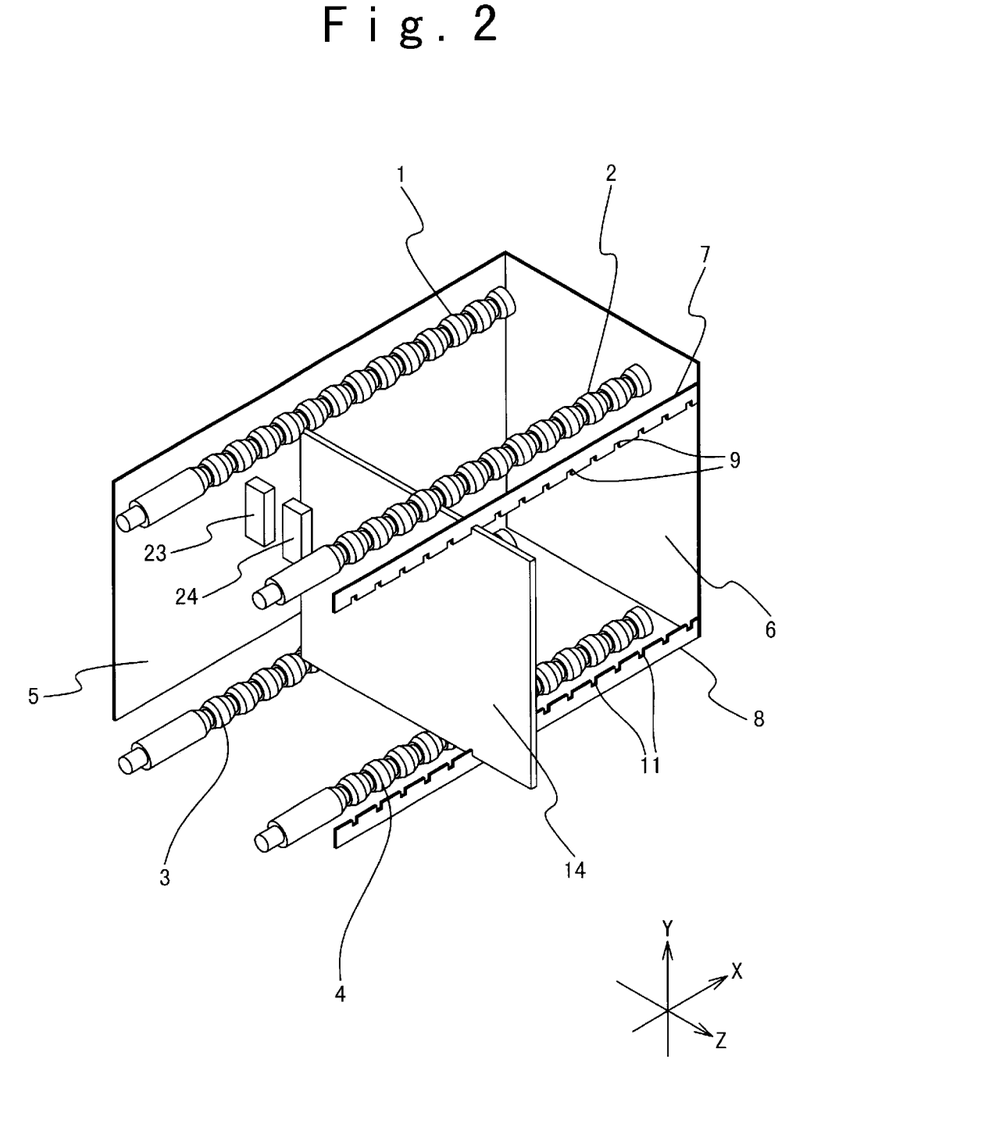
FIG. 2 is an axis projection view showing an embodiment of a mount shelf for an electronic circuit board according to the present invention.

As shown in FIG. 2, in an embodiment of a mount shelf for an electronic circuit board according to the present invention, a guide together with a body of a structure is disposed to form the structure of the shelf. The body is constituted by a metallic plate. Four guides 1, 2, 3 and 4 are fixed to and supported on the metallic plate. The metallic plate constituting the body is provided with a back board 5 usually oriented in a vertical direction, and side plates 6 (only one side is shown) on both sides which are usually oriented in the vertical direction and oriented in the direction orthogonal to the back board 5. A Z-axis is set for the direction orthogonal to the back board 5, a Y-axis is set for the vertical direction, and an X-axis is set for the direction orthogonal to the side plate 6. The three axes X, Y and Z create a three-dimensional orthogonal coordinate system.

An upper guide plate 7 and a lower guide plate 8 are placed between the side plates 6 on both the sides. A lower edge of the upper guide plate 7 is parallel to an upper edge of the lower guide plate 8, and it is oriented in the X-axis direction. A plurality of upper guide grooves 9 are formed in the lower edge of the upper guide plate 7 at a predetermined interval. A plurality of lower guide grooves 11 are formed in the upper edge of the lower guide plate 8 at the same predetermined interval. The plurality of upper guide grooves 9 are arranged in the plurality of lower guide grooves 11, under the positional correspondence. The predetermined interval between the plurality of upper guide grooves 9 adjacent to each other is equal to the predetermined interval between the plurality of lower guide grooves 11 adjacent to each other.

The four guides 1, 2, 3 and 4 are constituted by the first guide 1, the second guide 2, the third guide 3 and the fourth guide 4. The first guide 1 is placed at a position closer to the back board 5 than the second guide 2. The third guide 3 is placed at a position closer to the back board 5 than the fourth guide 4. A height of the Y-axis direction of the first guide 1 is equal to a height of the Y-axis direction of the second guide 2 with respect to a standard surface, and a height of the Y-axis direction of the third guide 3 is equal to a height of the Y-axis direction of the fourth guide 4 with respect to the standard surface. A separation distance between the first guide 1 and the second guide 2 is equal to a separation distance between the third guide 3 and the fourth guide 4. The four guides 1, 2, 3 and 4 have axis lines (12), respectively. Those four axis lines (12) are parallel to each other. The four guides 1, 2, 3 and 4 are formed symmetrically about their axis lines (12), respectively, and their shapes and dimensions are equal to each other.

Figure 3:
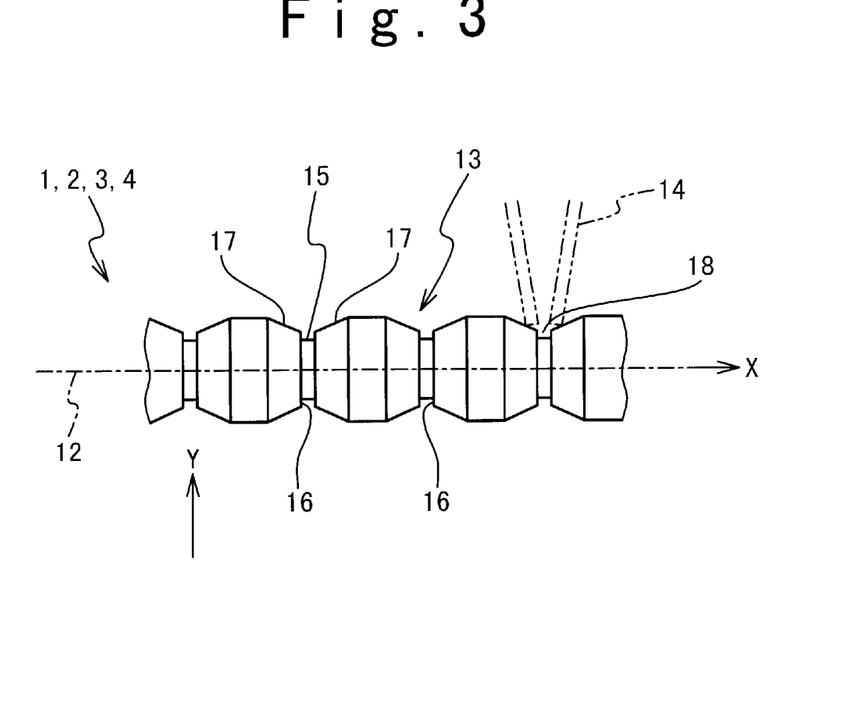
FIG. 3 is a front view showing a part of a guide (support bar)

The guides 1, 2, 3 and 4 (hereafter, represented by 1) have the axis lines 12 as shown in FIG. 3, and configure a plurality of positioning guide concave grooves 13. The positioning guide concave groove 13 guides an electronic circuit board 14, especially in the Y-axis direction, and further even in the X-axis direction. A circumference plane of the positioning guide concave grooves 13 is constituted by a small diameter cylindrical plane 15 sharing the axis line 12, axis square planes 16 which are connected to the small diameter cylindrical plane 15 and orthogonal to the small diameter cylindrical plane 15 on both the sides, and truncated circular cone planes 17 connected to the axis square planes 16 on both the sides, respectively. The two truncated circular cone planes 17 are located opposite to the direction of the axis line, and inclined in the direction opposite to the axis line direction.

Figure 4:
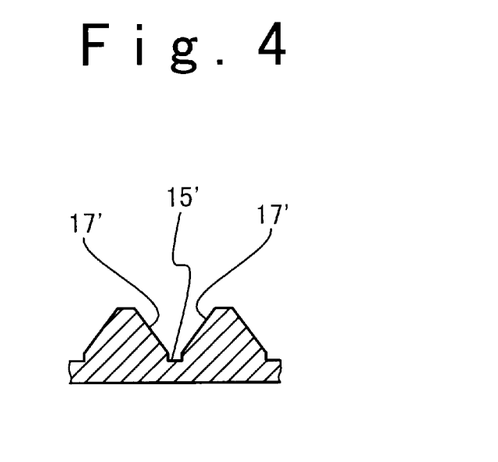
FIG. 4 is a front section view showing another guide.
Figure 7:
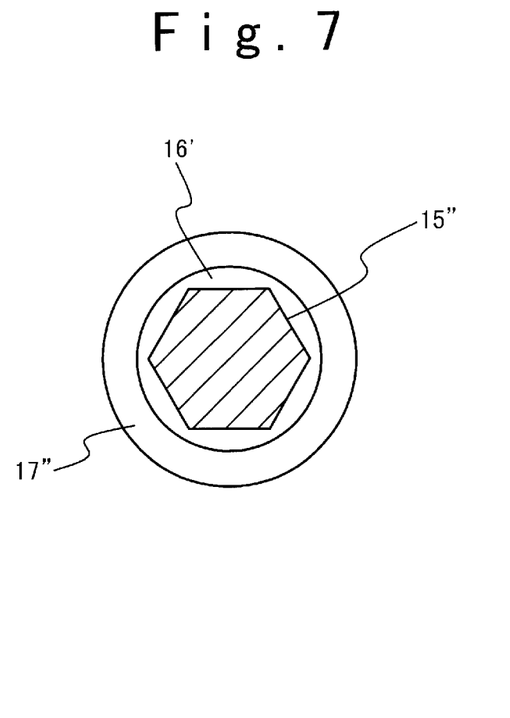
FIG. 7 is a side section view showing still another guide.

The truncated circular cone plane 17 and the small diameter cylindrical plane 15 are not limited to the perfectly circular cone plane forming the closed circumference plane and the perfect cylindrical plane. They may be created as a half circular cone plane 17' and a half cylindrical plane 15', as shown in FIG. 4. The half circular cone plane 17' and the half cylindrical plane 15' as mentioned above are opposite to each other in the upper and lower directions, in the first guide 1 and the third guide 3, and opposite to each other in the upper and lower directions, in the second guide 2 and the fourth guide 4. The circular cone plane is the perfect circular cone plane or the approximately circular cone plane, in this way. A spherical surface, an elliptically spherical surface and a half elliptically spherical surface are the approximately circular cone plane, and constitute a two-dimensional slant similar to the circular cone plane. Such a two-dimensional slant constitutes the two-dimensional slant for guiding the edges of the electronic circuit board 14 in the X-axis direction and the Y-axis direction, and then guiding to a groove space 18 formed between the right and left axis square planes 16 opposite to each other. The typical example of such a two-dimensional slant is the circular cone plane. The cylindrical plane 15, the axis square plane 16 and the circular cone plane 17 can be changed for a slant flat plane 15", a quarter axis square plane 16" and a quarter circular cone plane 17" as shown in FIG. 7.

Figure 8:
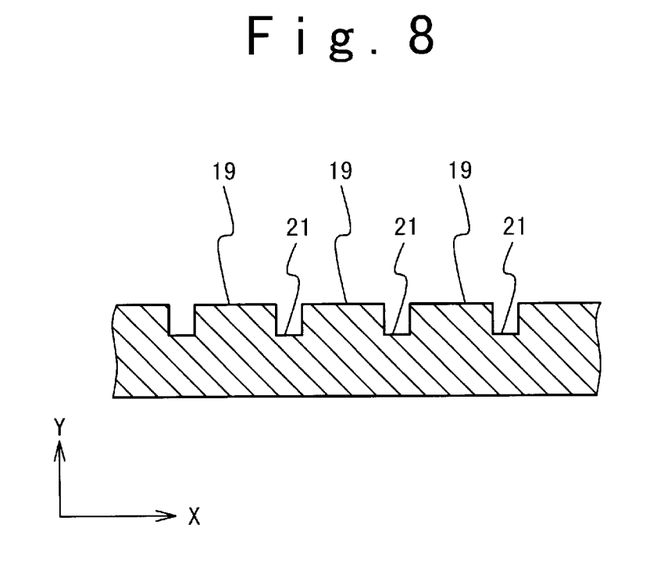
FIG. 8 is a front section view showing still another guide.
Figure 9:
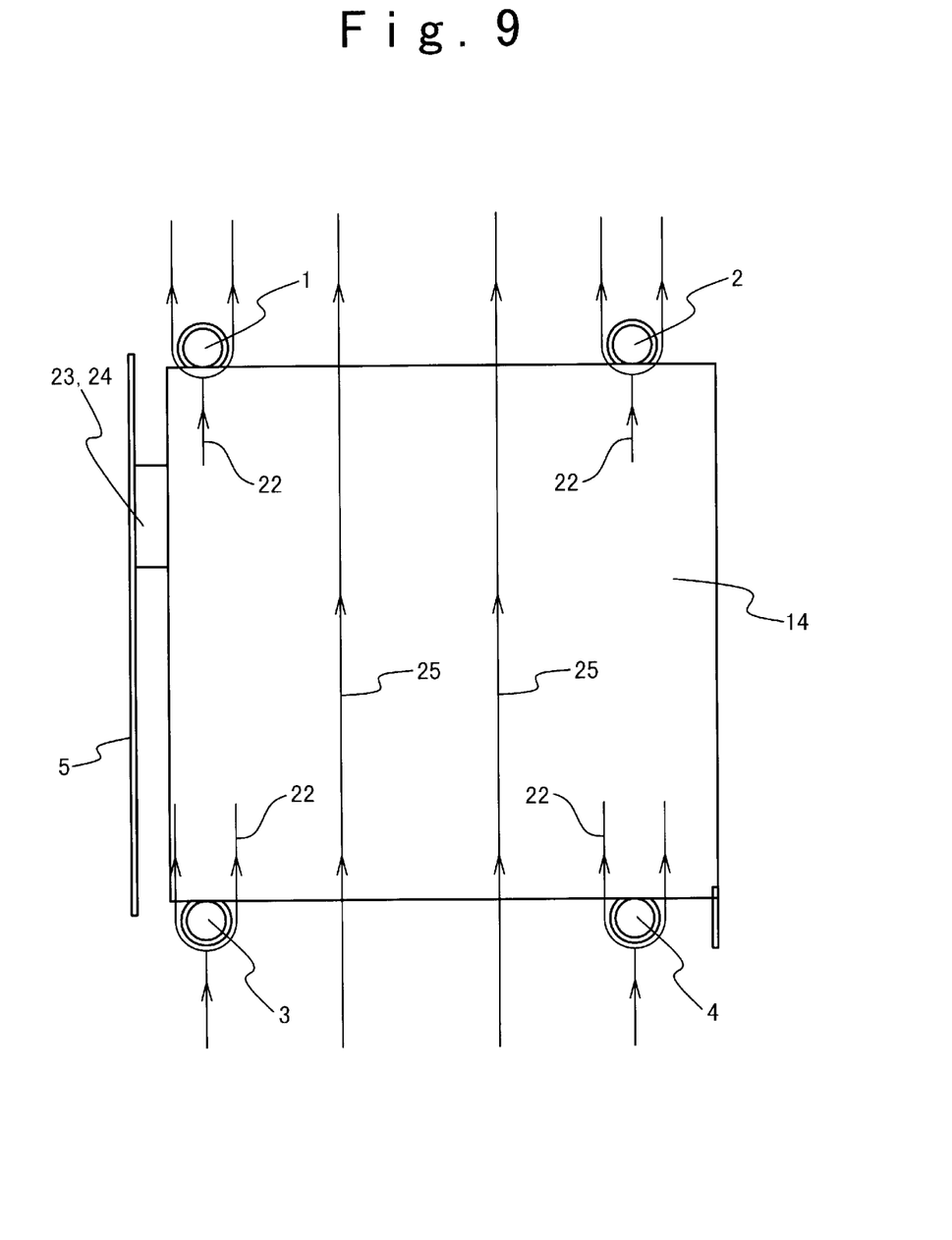
FIG. 9 is a side view showing still another positional relation between a guide and an electronic circuit board.

FIG. 8 shows another embodiment which does not have the function of guiding in the X-axis direction and has only the function of guiding in the Y-axis direction. This first guide 1 is a grooved circular cylinder in which a large diameter cylindrical plane 19 and a small diameter cylindrical planes 21 are reciprocally aligned. The structure symmetrical about the axis line 12 can protect the occurrence of the turbulent flow without any interference with the flow adjustment property of an air flow 22, as shown in FIG. 9.

Figure 5:
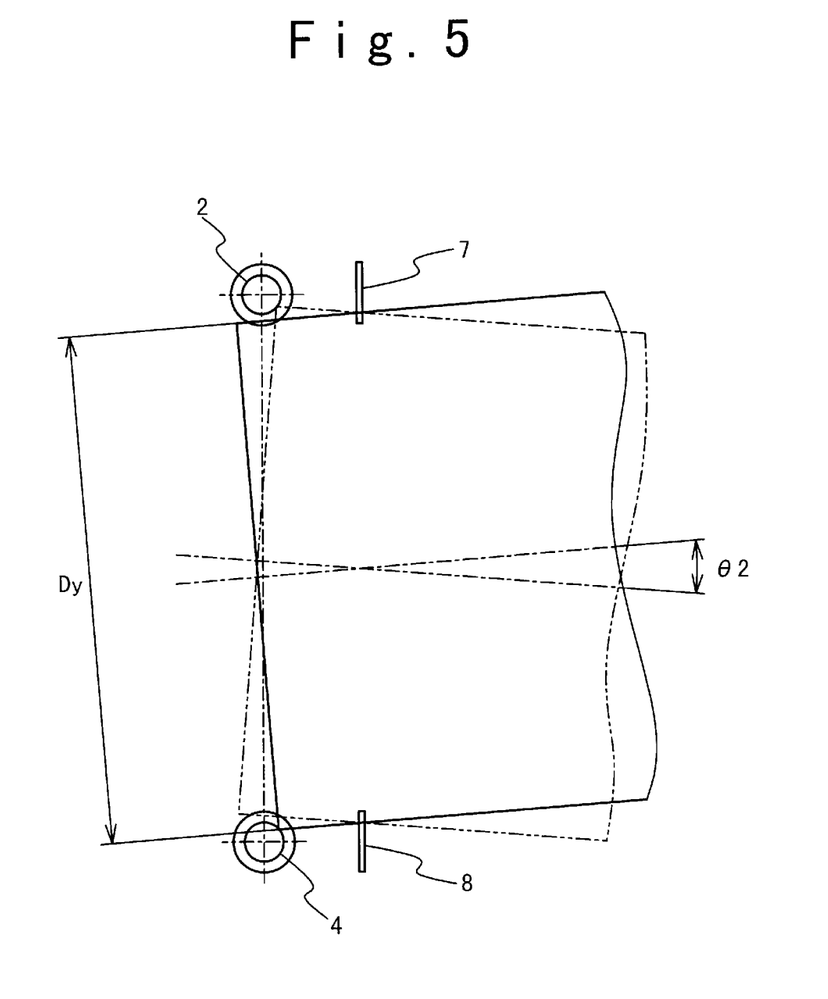
FIG. 5 is a side view showing a positional relation between a guide and an electronic circuit board.
Figure 6:
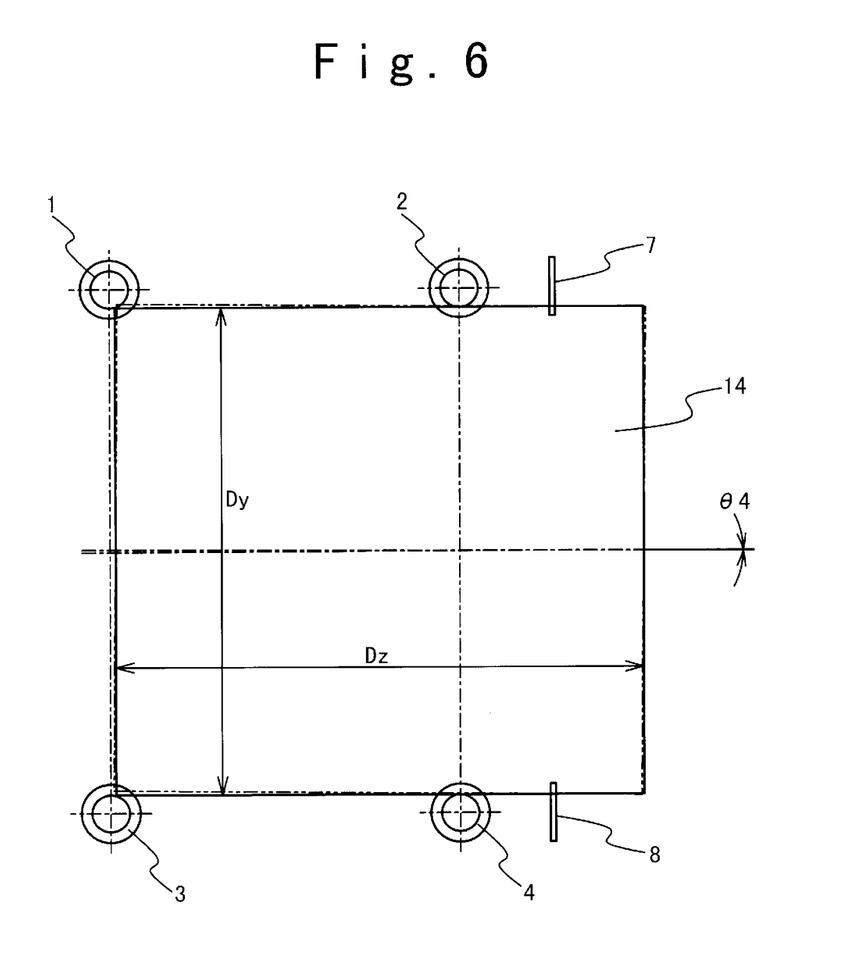
FIG. 6 is a side view showing another positional relation between a guide and an electronic circuit board.

The shortest distance in the Y-axis direction between the small diameter cylindrical plane 15 of the third guide 3 and the small diameter cylindrical plane 15 of the first guide 1 is slightly longer than a width Dy in the Y-axis direction of the electronic circuit board 14, as shown in FIGS. 5, 6. And, the shortest distance in the Y-axis direction between the small diameter cylindrical plane 15 of the fourth guide 4 and the small diameter cylindrical plane 15 of the second guide 2 is slightly longer than the width Dy. A distance between the axis line 12 of the second guide 2 and the axis line 12 of the first guide 1 is longer than a width Dz in the Z-axis direction of the electronic circuit board 14. And, the distance between the axis line 12 of the fourth guide 4 and the axis line 12 of the third guide 3 is longer,than the width Dz.

A body side connector 23 is attached to the inner side of the back board 5, as shown in FIG. 2. A board side connector 24 is attached to the electronic circuit board 14. One plane of the body side connector 23 and one plane of the board side connector 24 are positioned substantially coincident with the Y-Z plane or the plane parallel to it (the plane orthogonal to the axis line 12), and minute electrical contact portions such as solder balls of both the connectors are joined to each other. When the installation of the electronic circuit board 14 is ended, the electronic circuit board 14 is surrounded with the walls of four circumferences (the two walls are the back board 5 and the side plate 6). However, the ceiling side and the bottom sides are opened. Such walls of the four circumferences serve for a heat radiation plate.

Figure 10:
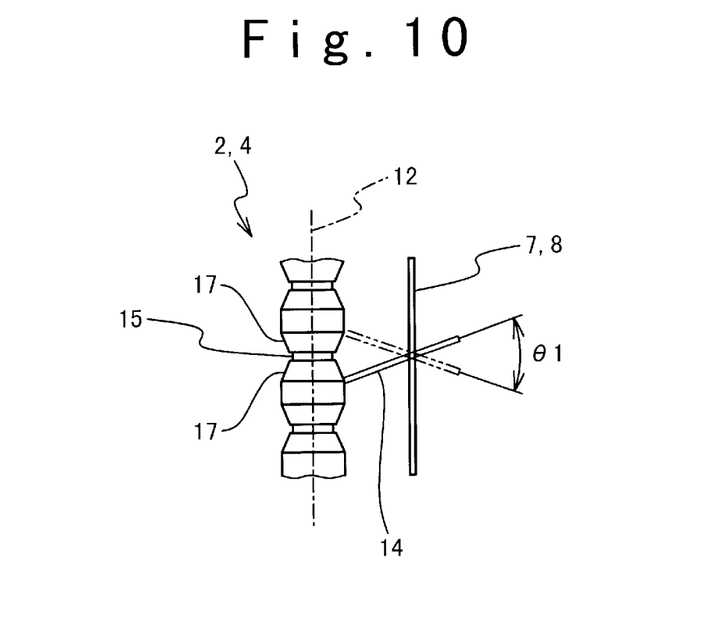
FIG. 10 is a side view showing still another positional relation between a guide and an electronic circuit board.

The upper and lower portions of a front edge located ahead of the insertion direction of the electronic circuit board 14 are firstly introduced into the plurality of upper guide grooves 9 of the upper guide plate 7 and the plurality of lower guide grooves 11 of the lower guide plate 8, and then pushed and advanced while swung in the range between a swung angle of a rotational angle θ2 around the X-axis (refer to FIG. 5) and a swung angle of a rotational angle θ1 around the Y-axis (refer to FIG. 10) in the direction substantially orthogonal to the back board 5 (Z-axis direction) towards the back board 5. A width of the X-axis direction of the groove space 18 is slightly longer than a thickness of the electronic circuit board 14 so that both the sides of the electronic circuit board 14 come in contact with the two axis square planes 16 opposite to each other at the same time. Thus, as shown in FIGS. 5, 10, there may be a high possibility that the upper portion of the front edge of the electronic circuit board 14 strikes the lower half of the truncated circular cone plane 17 of the second guide 2 and that the lower portion of the front edge of the electronic circuit board 14 strikes the upper half of the truncated circular cone plane 17 of the fourth guide 4. The thus-striking upper or lower portion of the front edges of the electronic circuit board 14 is introduced into the two-dimensional slant 17 that is the circular cone plane, and guided in the X-axis direction and the Y-axis direction. Its guide force is smoothly applied to the electronic circuit board 14. The unreasonable force is never applied to the electronic circuit board 14. So, the lower edge of the electronic circuit board 14 is reasonably introduced into the groove space 18.

There may be a high possibility that the upper portion of the front edge of the electronic circuit board 14 receiving the further pushed force strikes the lower half of the truncated circular cone plane 17 of the first guide 1, in the same condition as the situation shown in FIG. 10, and that the lower portion of the front edge of the electronic circuit board 14 strikes the upper half of the truncated circular cone plane 17 of the third guide 3.

Upon reception of the application force as mentioned above, the lower edge and the upper edge of the electronic circuit board 14 are reasonably introduced into the groove spaces 18 of the first guide 1 and the third guide 3.

Figure 11:
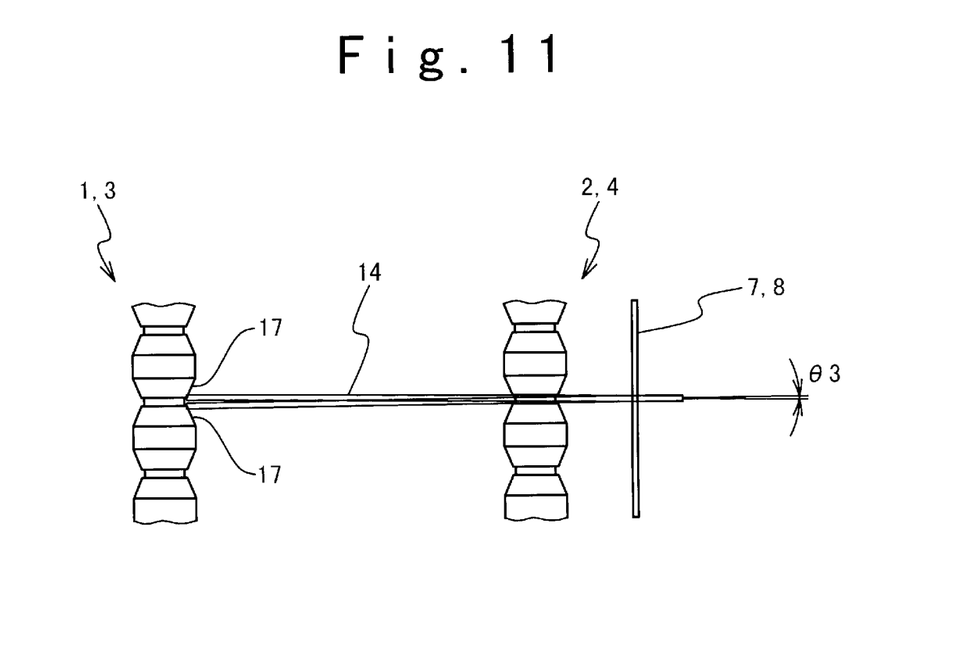
FIG. 11 is a plan view showing still another positional relation between a guide and an electronic circuit board.

In the course of such introduction, as shown in FIGS. 6 and 11, at least three-point regions corresponding to the upper and lower portions of the front edge of the electronic circuit board 14 and the upper and lower portions of the rear edge thereof are restricted by the first guide 1, the second guide 2, the third guide 3 and the fourth guide 4. The electronic circuit board 14 is minutely adjusted in the range between swung angles θ3, θ4 smaller than the above-mentioned angles θ1, θ2. Then, the minute adjustment force is applied to the electronic circuit board 14 so that the bending forces are generated in the upper and lower portions of the front edge of the electronic circuit board 14 and in the upper and lower portions of the rear side thereof. However, the introduction force applied to the electronic circuit board 14 by the truncated circular cone planes 17 at the four or three locations is smooth, and the introduction force is gradually applied such that the simultaneous restriction forces do not distortion largely the electronic circuit board 14.

The electronic circuit board 14 mounted in the shelf as mentioned above disperses and discharges the heat generated by the board 14 itself to peripheral portions, and its heat is dispersed from the outer circumferences of the back board 5 and the side plates 6 of the four circumferences. However, a part of the heat increases the temperature of the inner air surrounded with the walls of the four circumferences. Most of the air flow circulating from the bottom side to the ceiling side is raised in a flow adjustment manner on a flow path having no obstacle from the bottom side to the ceiling side. The part 22 of the air flow strikes the first guide 1, the second guide 2, the third guide 3 and the fourth guide 4, as shown in FIG. 9. However, all the circumferences or the part thereof is formed in the form of the cylinder (the form of the streamline). Their flow adjustment properties are not broken, and they are kept. Thus, the turbulent flow and the eddy action are protected. Ascending air current is discharged smoothly and quickly. Hence, the cooling effect is large.

The planes formed on the first guide 1, the second guide 2, the third guide 3 and the fourth guide 4, such as the cylindrical plane or the circular cone plane are formed as the guide planes and the streamline planes. If the streamline planes are disposed even on the front flow side and the rear flow side of the air flows passing in the vicinities of the first guide 1, the second guide 2, the third guide 3 and the fourth guide 4 serving as the support bars for supporting the electronic circuit board 14 and the positioning bars for positioning it, the turbulent flow protection effect can be attained stronger. If they are formed especially symmetrical about the axis line, the turbulent flow protection effect is attained much stronger.

The mount shelf for the electronic circuit board according to the present invention provides the high cooling effect, and simultaneously provides the positioning effect while avoiding the offset of the cooling effect. Moreover, the unreasonable force is not applied at the time of the insertion, and the cooling effect is provided at the same time.

What is claimed is:

1. A mount shelf for an electronic circuit board, comprising:

a body; and four guides which are supported by said body, and respectively have parallel axis lines, and are extended in direction of said axis lines, wherein each of said four guides has a plurality of concave grooves aligned in said direction of said axis lines, and wherein each of said plurality of concave grooves has a first side and a second side crossing said axis lines and a cylindrical plane for connecting between said first side and said second side, and wherein two said cylindrical planes of said four guides are contactable with a first edge region of said electronic circuit board at a same time, and the other two said cylindrical planes of said four guides are contactable with a second edge region of said electronic circuit board at the same time.

2. The mount shelf for an electronic circuit board according to claim 1, wherein said first upper edge and second lower edge are approximately parallel to each other.

3. The mount shelf for an electronic circuit board according to claim 1, wherein each said concave groove is respectively constituted by at least one truncated circular cone plane with at least one slant.

4. The mount shelf for an electronic circuit board according to claim 1, further comprising:

an upper guide plate supported by said body; and a lower guide plate supported by said body, and wherein said upper guide plate has a first plurality of upper guide grooves for guiding said first upper edge, and said lower guide plate has a second plurality of lower guide grooves for guiding said second lower edge, and wherein positions of said first plurality of upper guide grooves correspond to positions of said concave grooves on said guides, respectively, and positions of said second plurality of lower guide grooves correspond to positions of said concave grooves on said guides, respectively.

5. The mount shelf for an electronic circuit board according to claim 1, wherein said cylindrical plane has a form of a cylinder split in half along a longitudinal axis.

6. The mount shelf for an electronic circuit board according to claim 1, wherein said first side and said second side are formed in a direction of a crossing tapered plane which are not orthogonal to said axis lines.

7. The mount shelf for an electronic circuit board according to claim 6, wherein said crossing tapered plane has a conical shape.

8. The mount shelf for an electronic circuit board according to claim 7, wherein said conical shape is a perfectly circular cone plane.

9. The mount shelf for an electronic circuit board according to claim 8, wherein each of said guides has an outer cylindrical circumference plane situated between said plurality of concave grooves.

10. The mount shelf for an electronic circuit board according to claim 1, wherein said concave grooves includes two slants which are located opposite to each other, and slanted in directions opposite to each other.

11. The mount shelf for an electronic circuit board according to claim 1, wherein each of said guides includes a concave groove for mounting and positioning said electronic circuit board in first and second predetermined positions.

12. A mount shelf for an electronic circuit board, comprising:

peripheral walls; and four support bars supported on said peripheral walls in an inner space formed by said peripheral walls, and respectively have axis lines parallel to each other, and are extended in directions of said axis lines, wherein each of said four support bars has at least one positioning guide groove aligned in said direction of said axis line for guiding said electronic circuit board, and said four support bars position and support four-point regions around edges of said electronic circuit board, and wherein a streamline plane is formed by an air stream in a direction from two said support bars of said four support bars to the other two said support bars of said four support bars which is not turbulent on said support bars.

13. The mount shelf for an electronic circuit board according to claim 12, wherein said four support bars interfere in said direction of a flow of said air stream.

14. The mount shelf for an electronic circuit board according to claim 12, wherein said air stream flowing near each of said support bars forms a front flow side defining a first streamline plane and a rear flow side defining a second streamline plane.

15. The mount shelf for an electronic circuit board according to claim 12, wherein said four support bars have groove spaces for positioning said four-point regions, and a circumference of each of said groove spaces is formed in a direction of said streamline plane.

16. The mount shelf for an electronic circuit board according to claim 12, wherein said streamline plane is formed symmetrically about said axis line of said support bar.

17. The mount shelf for an electronic circuit board according to claim 12, wherein said four support bars have groove spaces for positioning said four-point regions.

18. The mount shelf for an electronic circuit board according to claim 12, wherein a circumference of a groove space is formed on said streamline plane.

\* \* \* \* \*